US006710598B2

(12) United States Patent
Leussler et al.

(10) Patent No.: US 6,710,598 B2
(45) Date of Patent: Mar. 23, 2004

(54) RF SURFACE RESONATOR FOR A MAGNETIC RESONANCE IMAGING APPARATUS

(75) Inventors: Christoph Guenther Leussler, Hamburg (DE); Daniel Zahn, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/181,595

(22) PCT Filed: Nov. 14, 2001

(86) PCT No.: PCT/EP01/13259
§ 371 (c)(1),
(2), (4) Date: Jul. 16, 2002

(87) PCT Pub. No.: WO02/41020
PCT Pub. Date: May 23, 2002

(65) Prior Publication Data
US 2002/0190717 A1 Dec. 19, 2002

(30) Foreign Application Priority Data
Nov. 16, 2000 (DE) .......................................... 100 56 807

(51) Int. Cl.[7] ................................................ G01V 3/00
(52) U.S. Cl. ........................ 324/318; 324/322; 600/422
(58) Field of Search ................................ 324/318, 322, 324/300, 307, 309, 314; 600/422, 421

(56) References Cited

U.S. PATENT DOCUMENTS 5,143,688 A * 9/1992 Mansfield ................... 324/318
5,153,517 A   10/1992 Oppelt
6,320,383 B1 * 11/2001 Kato et al. .................. 324/318

FOREIGN PATENT DOCUMENTS

DE    199 14 989 C2    4/2002
JP    06051044         2/1994

OTHER PUBLICATIONS

Viohl, "Circular Polarized RF Coils for Open Magnet Systems"; Proceedings of the Society of Magnetic Resonance 3rd. Mtg., Aug. 1995; vol. 1, p. 183.
Srinivasan, "S/N Improvement in a Conventional Head Coil Toward Top of the Head", Proceedings of the International Society for Magnetic Resonance in Medicine, 5th Mtg.; Apr., 1997; vol. 3, p. 1514.
Murphy–Boesch, "A Single–Tuned Four Ring Birdcage Resonator for High B1 Homogeneity" Society of Magnetic Resonance in Medicine, 10th Mtg., 1991, vol. 1, p. 125.

(List continued on next page.)

Primary Examiner—Louis Arana
(74) Attorney, Agent, or Firm—Thomas M. Lundin

(57) ABSTRACT

The invention relates to an RF surface resonator (RF coil) for transmitting and/or receiving circularly polarized electromagnetic waves, which resonator is intended in particular for magnetic resonance imaging (MRI) apparatus in which a basic magnetic field (vertical field) that extends perpendicularly through an object to be examined and a circularly polarized RF field are generated. Various steps are proposed so as to achieve a desired variation of the field strength in the radial direction as well as in the direction of circulation. These steps concern the selection of the number, the shape and the length of radially extending conductor structures (30x, 31x, 32x, 33x; 40x, 41x, 42x, 43x) as well as of conductor loops (310 to 390; 410 to 490) for the return current, the shape of RF shields (12, 13), and the insertion of capacitive elements ($C_{ix}$, $C_{ax}$) between the conductor structures and the conductor loops on the one side and a reference potential on the other side, and also capacitive elements ($C_{lx}$) in the conductor structures and/or conductor loops. Finally, a desirable variation of the field strength can also be achieved by the separation of parts of the surface resonator by means of diodes (Dx) that can be switched.

11 Claims, 9 Drawing Sheets

OTHER PUBLICATIONS

Stensgaard, "A Four–Mode Shielded Loop Coil–System" Proceedings of the International Society for Magnetic Resonance in Medicine, 6th Mtg., Apr., 1998; vol. 3, p. 2030.

Srinivasan, "Evaluation of a "True" Dome Quadrature Head Coil for Functional Imaging" Proceedings of the Society of Magnetic Resonance, 3rd Mtg., Aug., 1995; vol. 2, p. 973.

Forbes, "Calculating Current Densities and Fields due to Shielded Bi–Planar Radio–Frequency Coils" Measurement Science & Technology, Sep., 1998, vol. 9, No. 9, pp. 1609–1619.

* cited by examiner

RF SURFACE RESONATOR FOR A MAGNETIC RESONANCE IMAGING APPARATUS

BACKGROUND

The invention relates to an RF surface resonator (RF coil) for transmitting and/or receiving circularly polarized electromagnetic waves, notably for magnetic resonance imaging apparatus (MRI apparatus) in which a basic magnetic field (vertical field) that extends perpendicularly through an object to be examined and a circularly polarized RF field are generated, and also relates to an MR apparatus that is provided with such an RF surface resonator.

In MRI apparatus of this kind the basic magnetic field is generated generally between two pole plates wherebetween an examination zone, for example for a patient, is situated. The basic magnetic field extends through a patient essentially in a direction perpendicular to the longitudinal axis thereof (generally speaking, vertically) so that, as opposed to imaging apparatus with a tubular examination space in which the basic magnetic field extends in the direction of the longitudinal axis of the patient, the patient remains suitably accessible from practically all sides, that is, also during image acquisition; in particular it is also possible to carry out interventional examinations. Systems of this kind, therefore, are also referred to as open MR systems or open MR imaging apparatus.

In order to generate an adequately strong and homogeneous basic magnetic field it is advantageous to keep the distance between the pole plates as small as possible. On the other hand, in order to avoid deterioration of the accessibility of the examination zone that is situated between the pole plates and of the patient comfort, an as large as possible distance is required; however, such a large distance may give rise to an inhomogeneous field. Therefore, as flat as possible (or at least flattish) RF conductor structures (surface resonators) are used to generate the RF field as well as to detect MR relaxation events; these structures are arranged over the pole plates and as near as possible thereto (or on an RF shield).

A surface resonator of this kind is known from U.S. Pat. No. 5,153,517. This resonator is composed of two subsystems, each of which is formed by two flat current loops and is arranged in such a manner that these systems are situated in a plane perpendicular to the direction of the basic magnetic field and are capable of generating a circularly polarized RF field. RF coils of this kind offer the advantage that in comparison with other configurations they require only a comparatively small transmission power, because essentially only field components that are relevant to the excitation of the nuclear magnetization or the detection of the relaxation events are generated or detected (that is, circular field components).

However, a problem is encountered in the proportioning and the application of such RF surface resonators, notably in the case of high field strengths of the main magnetic field; this problem concerns the radiation characteristic of the RF field that extends perpendicularly to the resonator plane. On the one hand an as homogeneous as possible field is required, that is a constant radial field strength distribution within the examination zone, whereas on the other hand it is desirable that the field decreases comparatively steeply in the space that is situated radially outside said examination zone; this is desirable so as to avoid backfolding or aliasing artifacts which may be due to the fact that the distribution of the main magnetic field is no longer homogeneous at that area and also due to the presence of attendant staff near the examination zone.

SUMMARY

It is an object of the invention, therefore, to provide an RF surface resonator that is intended notably for use in an open magnetic resonance imaging apparatus of the kind set forth and is capable of generating an RF field that has a high field strength which is homogeneous (meaning that it is essentially constant or at least that it varies only gradually without gradients in the field strength that influence the image quality) within an examination zone but decreases comparatively steeply in a space that is situated radially outside said zone.

This object is achieved by means of an RF surface resonator of the kind set forth which, in conformity with claim 1, is characterized in that there are provided a plurality of conductor structures that extend in radial directions from a central zone as well as at least one conductor loop that encloses the central zone and serves as a return for the current of the conductor structures, the radial distance between said conductor loop and the central zone being chosen to be such that a desired radiation characteristic is achieved in a plane extending perpendicularly to the surface resonator.

It is a special advantage of this solution that the radiation characteristic of the resonator can be comparatively simply adjusted (also in the built-in condition) by fitting additional conductor loops of the kind set forth.

The dependent claims relate to advantageous further embodiments of the invention.

In the embodiment in conformity with claim 2 a conductor density (number of conductor segments per unit of surface area) can be realized that remains essentially the same in the radial direction, so that a correspondingly more homogeneous variation of the radiation characteristic is obtained in the radial direction.

The embodiment disclosed in claim 3 enables a radiation characteristic which differs in different perpendicular planes to be achieved in a simple manner when, for example the RF field is intended to traverse exclusively an elongate object.

The characteristics disclosed in the claims 4 to 8 enable further influencing of the current distribution across the surface resonator in various ways so as to achieve a desired variation of the radiation characteristic.

In the embodiments that are disclosed in the claims 9 and 10 the radiation characteristic can be effectively influenced by electrical separation of parts of the surface resonator or disturbances of the RF field that are due to external interventions in the examination zone can be compensated.

DRAWINGS

Further details, characteristics and advantages of the invention will become apparent from the following description of a preferred embodiment that is given with reference to the drawing. Therein:

DESCRIPTION

Figure 1:
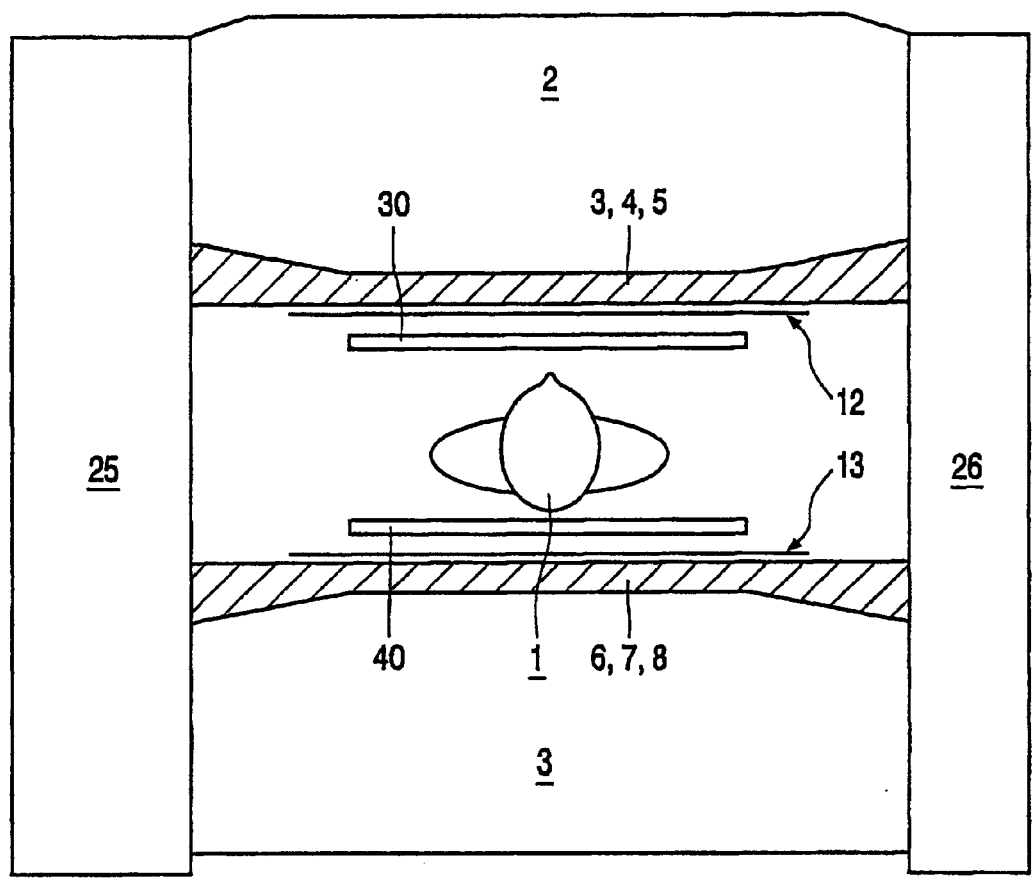
FIG. 1 is a diagrammatic representation of a magnetic resonance imaging apparatus.

FIG. 1 is a diagrammatic side elevation of a magnetic resonance imaging apparatus which is also referred to as a magnetic resonance examination apparatus. An examination zone in which an object 1 to be examined is arranged, for example a patient who is readily accessible from practically all sides, is situated between two columns 25, 26. The apparatus includes an assembly that is formed by a first, upper magnet 2 and a second, lower magnet 3 and is intended to generate a homogeneous, static basic magnetic field (main field) which traverses the examination zone in the vertical direction (the x direction) so as to magnetize the object to be examined, that is, so as to align the nuclear spins; the magnetic flux density (magnetic induction) of said main magnetic field may be of the order of magnitude of from some tenths of Tesla to some Tesla.

Three upper gradient magnetic field coils 3, 4, 5 and three lower gradient magnetic field coils 6, 7, 8 (not individually shown) are provided for the spatial discrimination and resolution of the signals emanating from the object 1 to be examined, said gradient coils generating three gradient magnetic fields that extend in the direction of the x axis. A first gradient magnetic field varies essentially linearly in the direction of the x axis whereas a second gradient magnetic field varies essentially linearly in the direction of the y axis and a third gradient magnetic field varies essentially linearly in the direction of the z axis.

Furthermore, in order to excite nuclear magnetization (spin resonance) in the object to be examined an RF transmission coil 30 (RF surface resonator) that can deliver an RF pulse is arranged over the object so that the object can be traversed by an RF magnetic field. For the detection of the relaxation that succeeds the excitation and induces a further change of the magnetization states in the object there is provided an RF receiving coil 40 (RF surface resonator) which is arranged underneath the object and in which such a change induces a corresponding voltage. When a suitable mode of switching over is adopted, a common RF surface resonator can also be used for the transmission as well as the reception, or the two RF surface resonators together can serve alternately for the transmission and the reception. Between the RF surface resonators 30, 40 and the respective neighboring gradient magnetic field coils 3, 4, 5 and 6, 7, 8 there is provided a respective RF shield 12, 13 for shielding the respective RF surface resonators from the gradient magnet coils. The signals received by the surface resonators are evaluated for MR imaging for which the gradient magnetic fields enable localization of the excited states.

Figure 2:
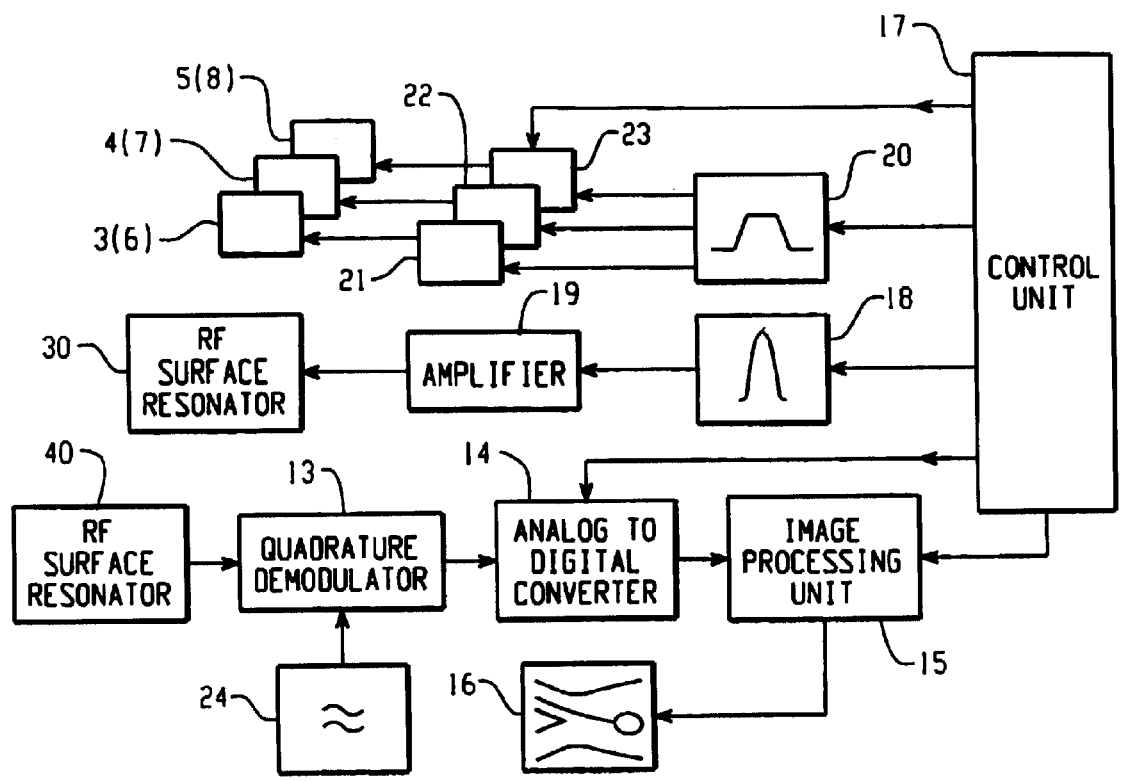
FIG. 2 shows a circuit diagram with the essential components of an MR imaging apparatus.

The components that are of essential importance to the operation of MR imaging apparatus of this kind are diagrammatically shown in FIG. 2; they include a control unit 17 which controls a gradient waveform generator 20 and is provided with outputs whereto a first, a second and a third gradient amplifier 21, 22, 23 are connected. Each of these amplifiers generates the current for the gradient coils 3, 4, 5; 6, 7, 8. The gain factors of these amplifiers can be adjusted independently of one another and the coils then generate the gradient fields in the x direction, the y direction and the z direction so that slice selection can be performed in known manner in the corresponding three spatial directions in the zone examined.

Furthermore, for the MR imaging the control unit 17 controls an RF generator 18 whereby essentially the frequency of the RF pulses is tuned to the Larmor frequencies that are dependent on the gradient fields. The RF pulses are applied to an amplifier 19 whose gain factor is controlled by the control unit 17; these pulses subsequently reach the transmitting RF surface resonator 30.

The MR signals that are induced in the receiving RF surface resonator 40 due to the relaxation of the excited magnetization states are demodulated in a quadrature demodulator 13 by mixing with two 90° mutually offset carrier oscillations (having a Larmor frequency or MR frequency that is determined by the local strength of the static magnetic fields) that are delivered by an oscillator 24, thus producing two signals which may be considered to be the real component and the imaginary component of a complex signal. These signals are applied to an analog-to-digital converter 14. Finally, an image processing unit 15 reconstructs the MR images in known manner for display on a monitor 16.

Figure 3:
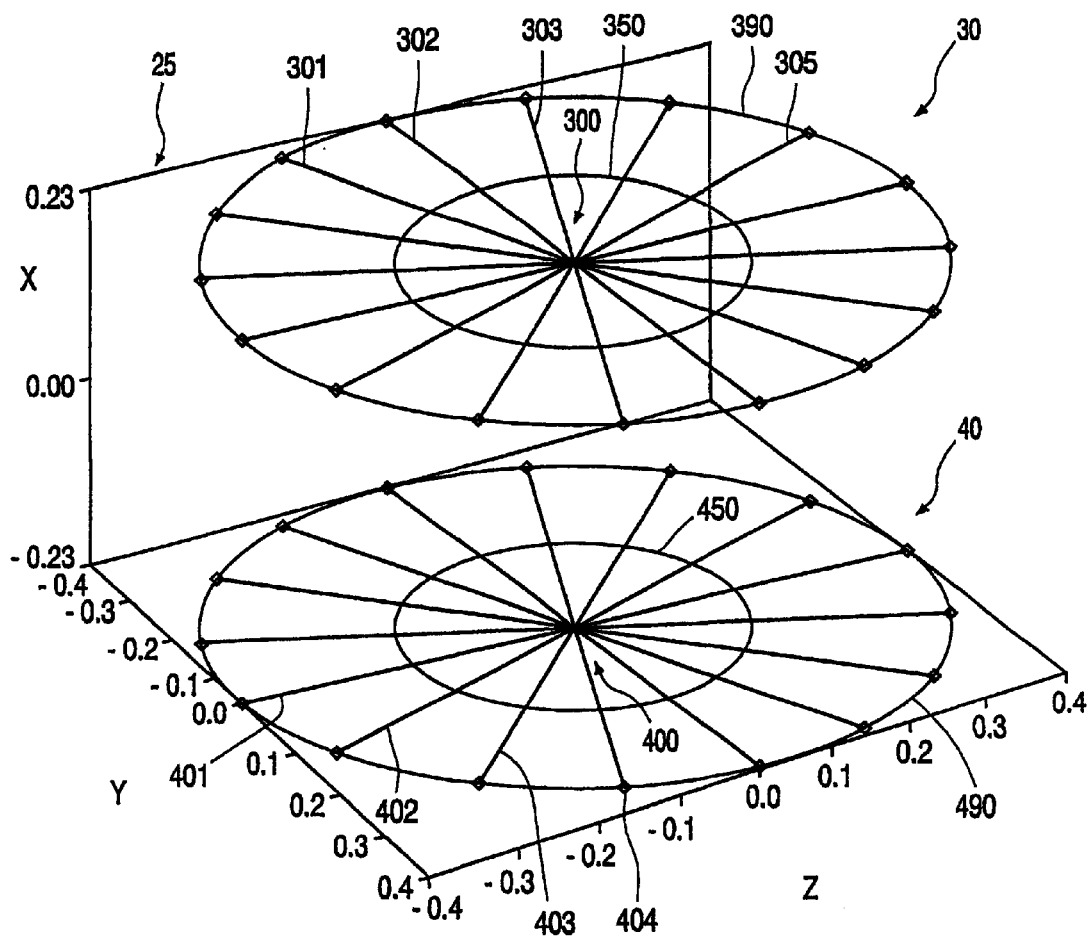
FIG. 3 is a diagrammatic representation of a first embodiment of an RF surface resonator.

FIG. 3 is a diagrammatic three-dimensional representation of a first embodiment of the basic structure of the RF surface resonators 30, 40 in accordance with the invention. Each of the surface resonators is formed by a number x of radially extending first conductor structures 30x and 40x, respectively (x=1, 2, 3, . . . ) which extend between a central zone 300, 400 and an essentially annular outer conductor 390, 490, respectively. Moreover, therebetween there is also provided at least one further annular conductor 350, 450, respectively. The annular conductors carry a reference potential and are connected to the radially extending conductor structures 30x, 40x and serve as return conductors for the RF currents flowing through the conductor structures.

The resonators 30, 40 are arranged in a respective y/z plane which extends parallel to the RF shield 12, 13 (FIG. 1). Because the conductor density (number of conductors per unit of surface area) is particularly high at the center, a correspondingly high RF field strength is produced at this area when current flows through the conductor structures; however, this strength decreases in the radial direction as the conductor density decreases. The at least one annular conductor 350; 450, producing a zero voltage point in the conductor structure and hence a drop of the field strength (like the outer conductor 390; 490), therefore, is radially arranged in such a manner that the high field strength in the central zone decreases and hence the decrease in the radial direction becomes more gradual so that overall the RF field distribution becomes more homogeneous and varies more gradually until it drops off comparatively steeply beyond the outer conductor 390; 490.

A further step that enables the RF field in the central zone to be reduced so that it can become more homogeneous in respect of the radial variation throughout the examination zone consists in making the distance between a surface resonator 30; 40 and the neighboring RF shield 12, 13 smaller in the central zone 300; 400 in comparison with this distance in zones that are situated further outwards in the radial direction. This can be achieved by making the conductor structures and/or the relevant RF shield 12, 13 extend essentially conically towards one another in the x/y plane. Moreover, either the volume available in the examination zone can thus be slightly enlarged or the gradient coils can be positioned nearer to the examination zone, thus improving the coupling in of energy into the object to be examined.

In order to realize an irradiation of the object to be examined that is circular in the y/z plane, the lengths of the conductor structures 30x, 40x are chosen to be such that the outer conductor 390, 490 each time forms a circle. Alternatively, it is also possible to realize an irradiation that is stretched in the y direction or the z direction by making the lengths of the conductor structures 30x, 40x correspondingly larger in these directions, so that the outer conductors 390, 490 enclose essentially an oval in the y/z plane.

In the first embodiment in conformity with FIG. 3 the conductor structures 30x, 40x are configured each time as a straight, continuous, radial conductor segment. The conductor structures, however, may alternatively be composed of a plurality of conductor segments which follow a course that deviates from the radial direction.

Figure 4:
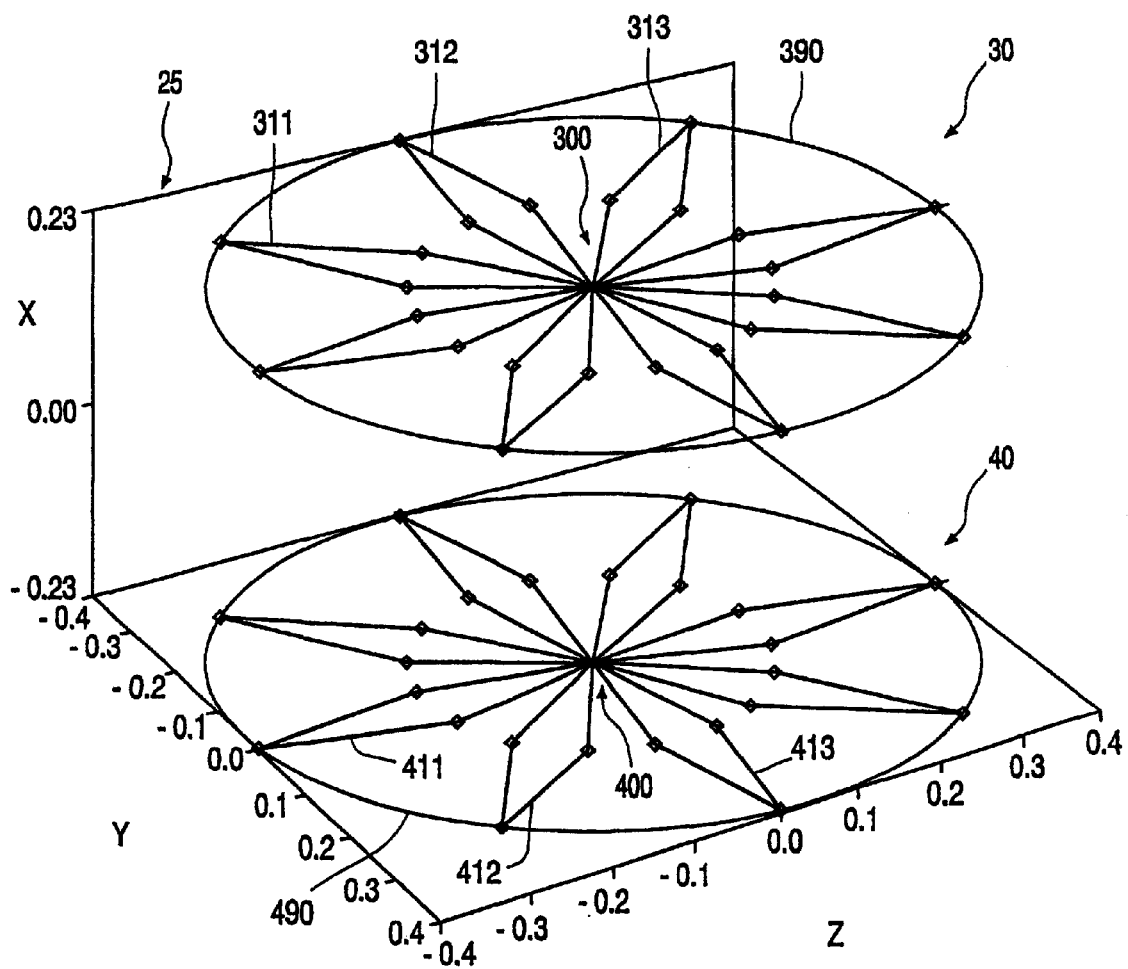
FIG. 4 is a diagrammatic representation of a second embodiment of an RF surface resonator.

FIG. 4 shows a second embodiment in this respect. The RF surface resonators 30, 40 are formed by (second) conductor structures 31x, 41x which are composed each time of four conductor segments which form a parallelogram and extend again between the central zone 300, 400 and the outer conductor 390, 490. In addition to the outer conductor there may again be provided at least one annular conductor 350, 450 in conformity with FIG. 3.

Figure 5:
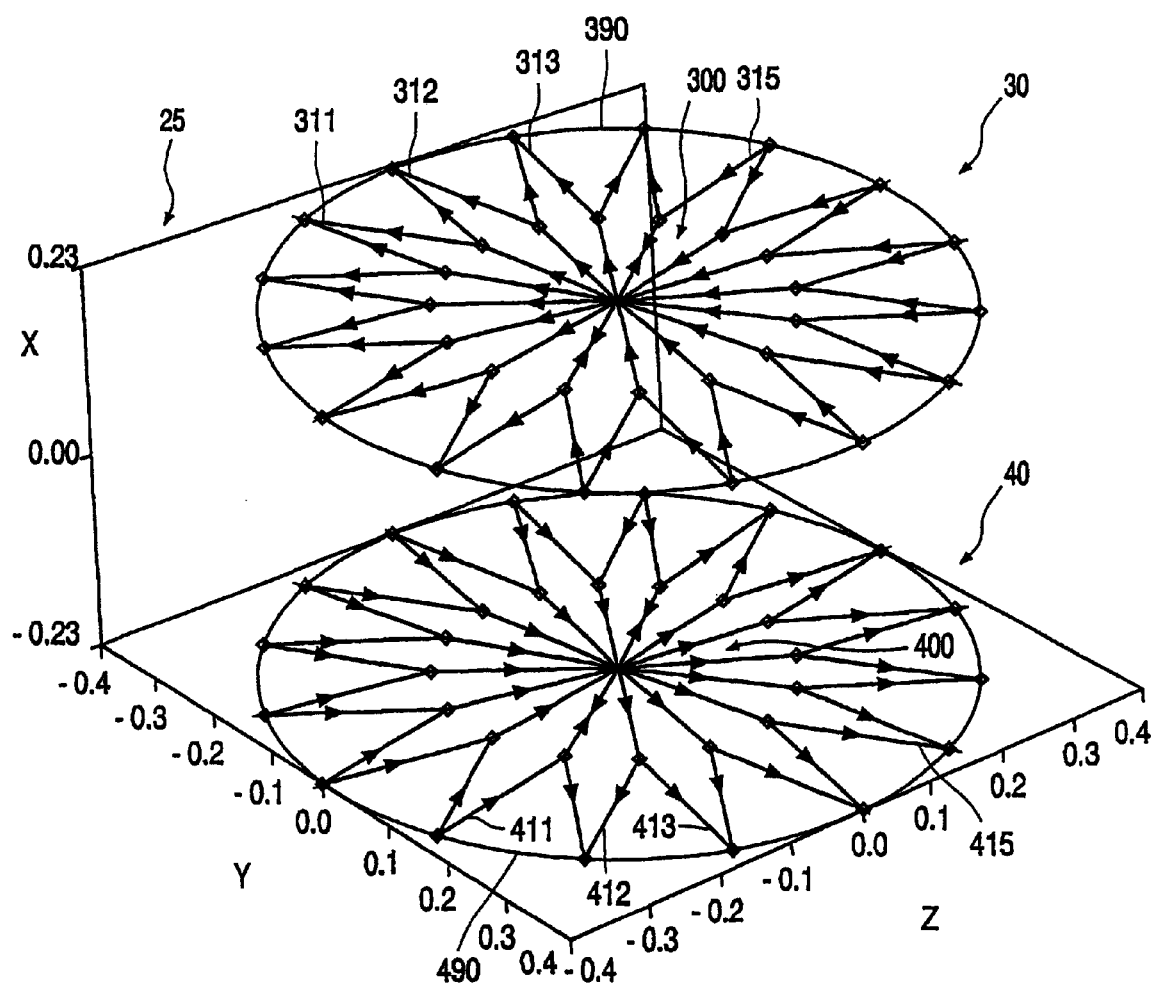
FIG. 5 is a diagrammatic representation of a third embodiment of an RF surface resonator.

The third embodiment that is shown in FIG. 5 comprises double the number of conductor structures 31x, 41x and neighboring conductor structures share each time one of the inner conductor segments, that is, a conductor segment that is situated in the central zone 300, 400. The outer conductor 390, 490 and the annular conductors 350, 450, if any, are configured in the same way as described for the first embodiment. In this Figure the arrows on the conductor segments indicate the current directions therein.

Figure 6:
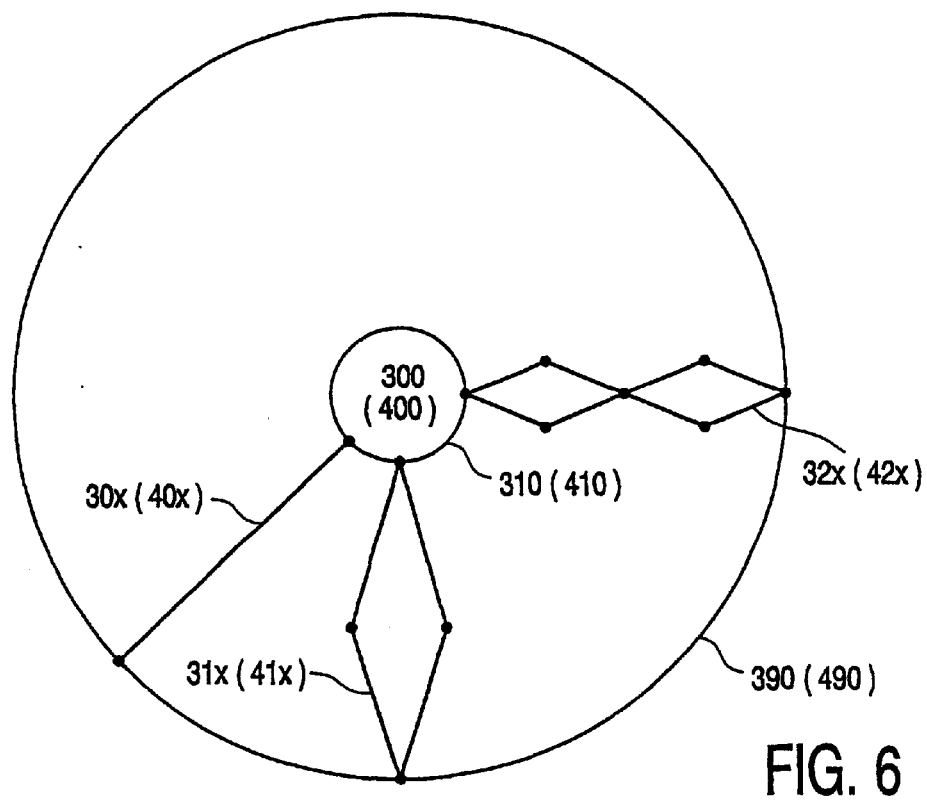
FIG. 6 shows alternative conductor structures for an RF surface resonator.
Figure 7:
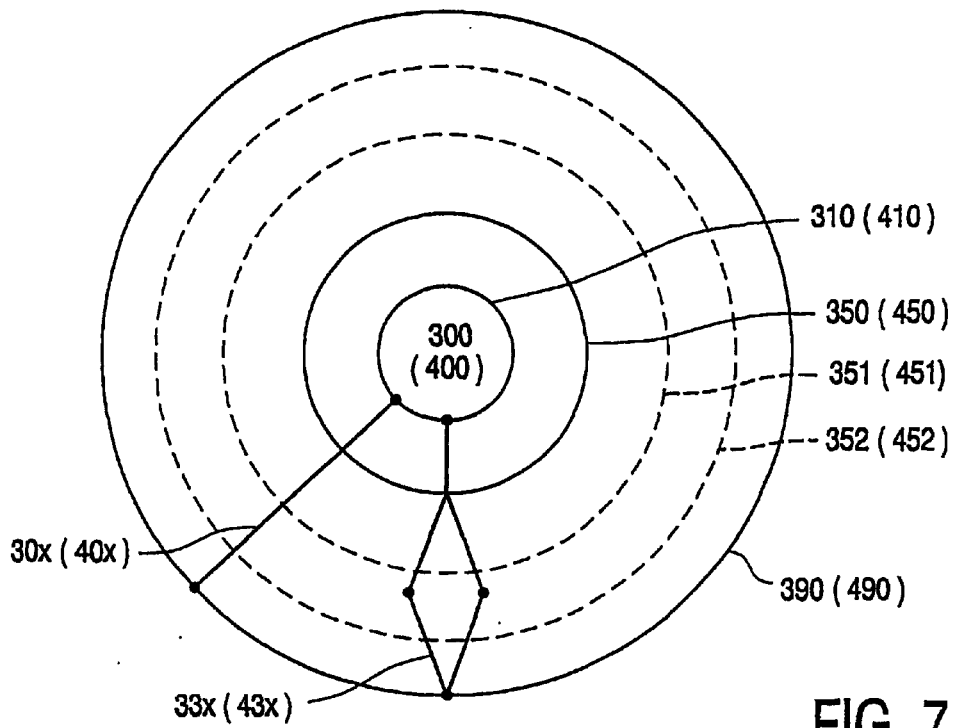
FIG. 7 shows various examples of further conductor loops of an RF surface resonator.

FIG. 6 shows, by way of example, three different conductor structures, that is, the first conductor structure 30x, 40x in conformity with FIG. 3, the second conductor structure 31x, 41x in conformity with the FIGS. 4 and 5, and a third conductor structure 32x, 42x which consists of two series-connected parts which form essentially a respective parallelogram. FIG. 7 also shows, in addition to the simplest first conductor structure 30x, 40x, a fourth conductor structure 33x, 43x which consists of a series connection of a parallelogram-shaped part as well as a single radial conductor segment.

The conductor structures are selected and configured in such a manner that the conductor density, that is, the number of conductors per unit of surface area, remains substantially constant across an as large as possible radial zone of the resonator. Consequently, the radial variation of the field strength of the RF field in the examination zone is homogeneous accordingly.

In order to avoid an excessive conductor density in the central zone 300 (or 400) and the associated excessive increase of the field strength, this zone may be formed by a first annular inner conductor 310, 410 in conformity with FIG. 6 wherefrom radially extending conductor structures 30x, 31x, 32x, 33x (40x, 41x, 42x, 43x) emanate. In conformity with FIG. 7 further annular conductors 350, 351, 390; 450, 451, 490 may be arranged so as to be concentric with the first annular inner conductor 310, 410; these further conductors are connected to the respective radially extending conductor structures and serve as return conductors for the currents flowing through the conductor structures. Such annular conductors induce a respective local decrease of the RF field strength, thus reducing local maximum values of the RF field so that overall the radial variation of the RF field can become more homogeneous.

The homogeneity of the RF field can be optimized further by suitable combination of these two parameters, that is, by selection of the type and the number of the conductor structures as well as the arrangement and the number of the annular conductors.

Figure 8:
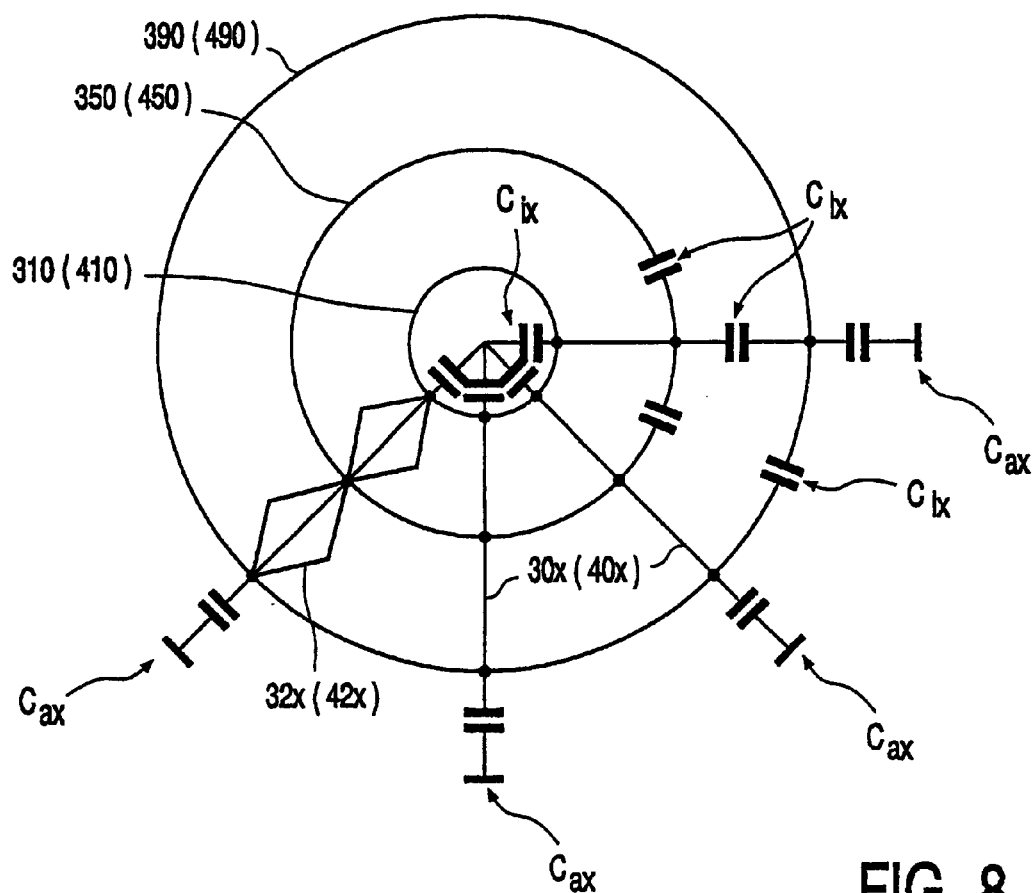
FIG. 8 shows various examples of the application of capacitors in the conductor structures.

A third parameter that is suitable for influencing the current distribution across the RF resonator in order to achieve the described object may be the insertion of capacitors in the conductor structures. This is shown by way of example in FIG. 8.

On the one hand the respective points of connection of the conductor structures 30x, 31x, 32x, 33x to the first annular inner conductor 310, 410, or to the outer conductor 390, 490, can be connected to the RF shield 12, 13 via a respective capacitor Cix or Cax (x=1, 2, 3, . . . ). As a result, the return currents can flow not only via the annular conductors but also via a second path and resonance currents can flow via ground and the RF shield. Alternatively, a return structure may be provided for the return current, said return structure essentially being identical to the conductor structures of the RF resonator and being connected between said resonator and the RF shield.

It may also be advantageous to connect one or more of the radial conductor structures, via the capacitors Cix and Cax provided at that area, to the RF shield 12, 13 or to the return structure instead of to the annular inner conductor 310, 410 and/or to the outer conductor 390, 490.

On the other hand, capacitors Clx (x=1, 2, 3, . . . ) may also be inserted directly in the conductor segments of the conductor structures and/or the annular conductors, so that resonance and hence current variations in the resonator can also be induced in conductor loops (meshes) formed from such conductor segments.

Figure 9:
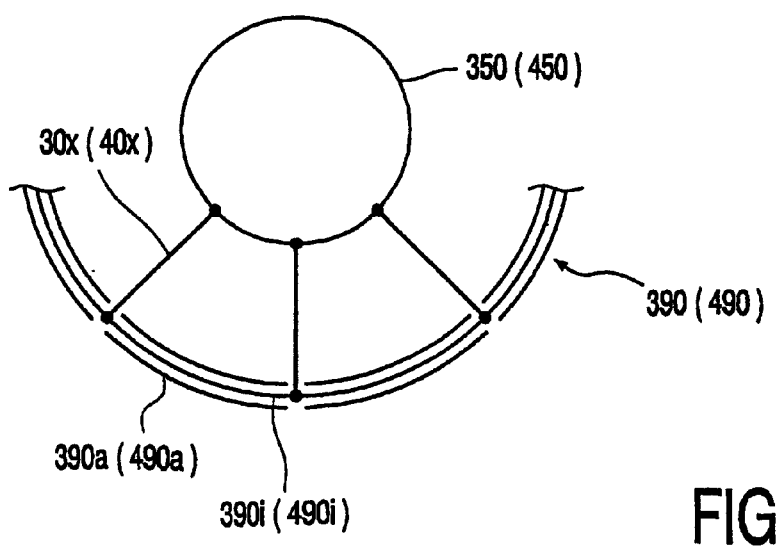
FIG. 9 shows a further example of a configuration of an RF surface resonator.

FIG. 9 shows a special embodiment of the annular outer conductor 390, 490 which is formed by a coaxial structure. The radial conductor structures 30x, . . . are now connected to the inner conductor 390i thereof. Variation of the length of the shield 390a between the connection points enables fine tuning of the homogeneity of the RF field notably in the edge zone of the RF surface resonator. As is customary, the shield 390a is connected to a reference potential. In principle one or more of the other annular conductors 310, 350, 351; 410, 450, 451 may also be formed by such a coaxial structure.

Figure 10:
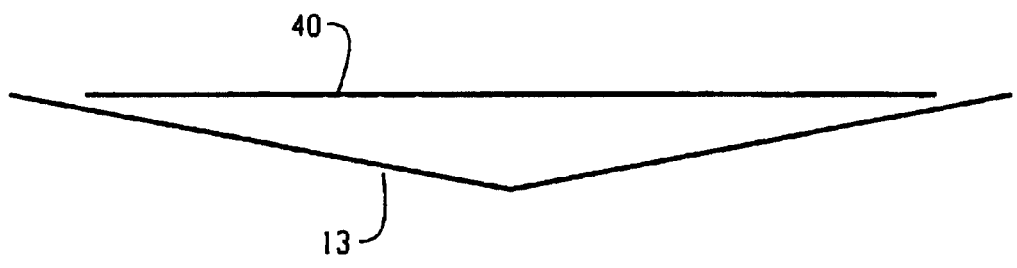
FIG. 10 shows a first embodiment of an RF shield of an RF surface resonator.

A further possibility for changing the RF field variation consists in changing the distance between the RF surface resonator and the RF shield. This procedure has already been explained with reference to a configuration of the RF surface resonator (and/or of the RF shield) that is conical in a cross-sectional view (x/y plane). FIG. 10 is a cross-sectional view of a first alternative in this respect; the RF shield 13 now approaches the RF surface resonator 40 in the radial direction. Because a reduction of the distance leads to a reduction of the RF field strength, this configuration is suitable to achieve a particularly steep decrease of the field strength in the edge zones of the RF surface resonator. The desired homogeneity in the inner zone can be preserved by taking one or more of the above-mentioned steps.

Figure 11:
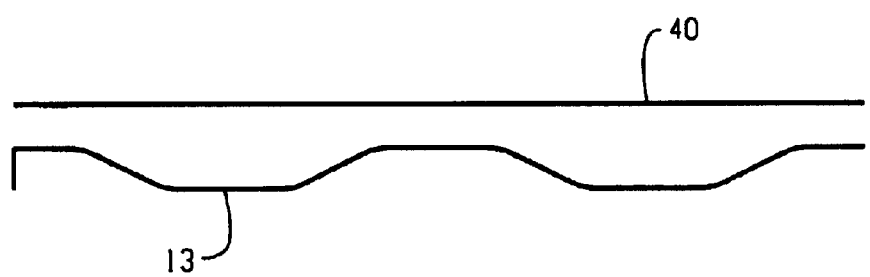
FIG. 11 shows a second embodiment of an RF shield of an RF surface resonator.

FIG. 11 shows a second alternative RF shield 13 which approaches the RF surface resonator 40 in the central zone as well as in the edge zone. The RF field strength can thus be reduced in the central zone as well as in the edge zone.

Figure 12:
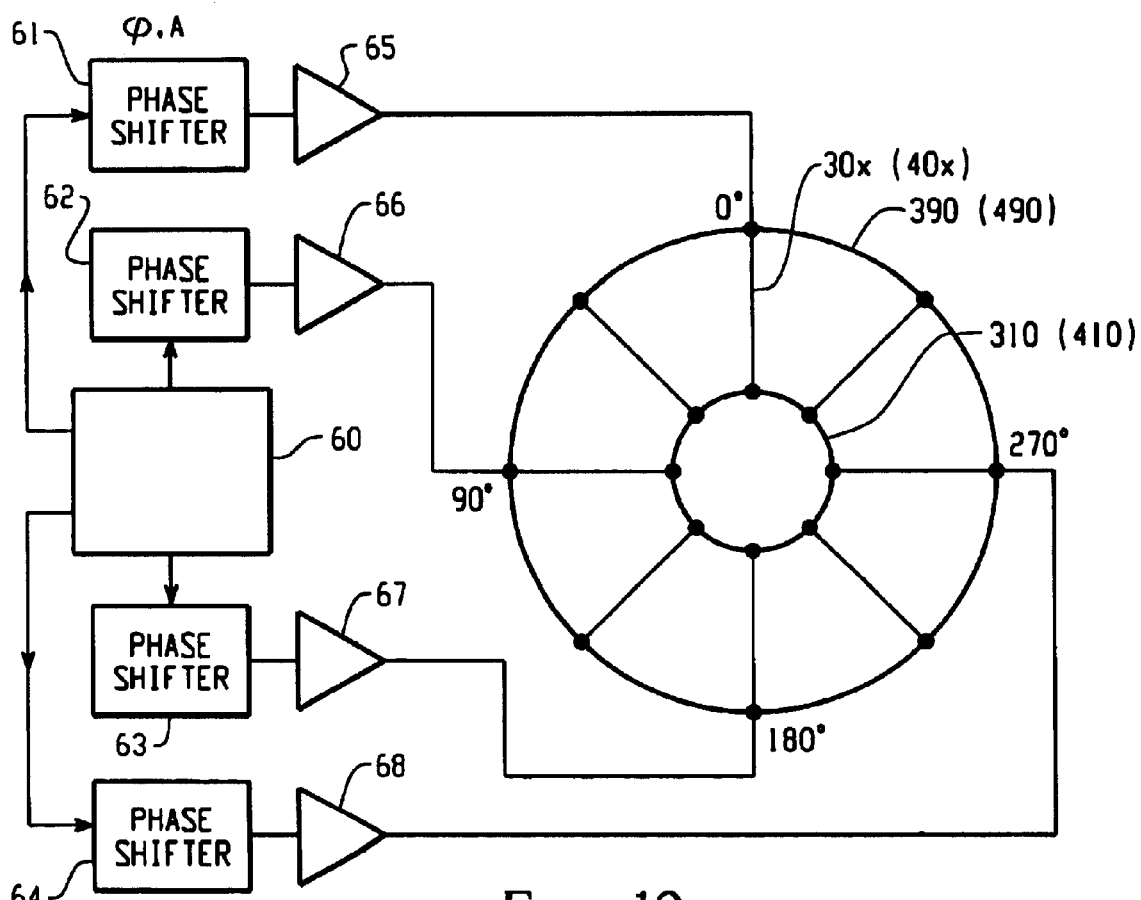
FIG. 12 shows a block diagram illustrating the power supply of the RF surface resonator.

The antenna is fed via at least two coupling-in points on the conductor structures 30x, ... and on the outer conductor 390 (490), said points being situated at an angular distance of 90 degrees from one another in the circumferential direction; they receive RF pulses that have been phase shifted by the same amount, so that the antenna emits a circularly polarized RF field. FIG. 12 shows, by way of example, four-phase feeding at points that are situated at a respective an angular distance of 90 degrees from one another. The RF pulses are produced by means of an oscillator circuit 60 so as to be applied to each coupling in point via an associated phase shifter 61 to 64 with a respective amplifier 65 to 68. Such multiphase coupling in enables, for example, a compensation of thermal expansions of individual conductor structures as well as compensation of attenuations of the rotating RF field by way of a corresponding adjustment of the phase filters or amplifiers, thus enabling also a correction of inhomogeneities in the circumferential direction. The number and the distribution of the points for coupling in along the outer conductor 390 (490) can be chosen independently from the configuration of the RF surface resonator as described with reference to the FIGS. 3 to 11.

Figure 13:
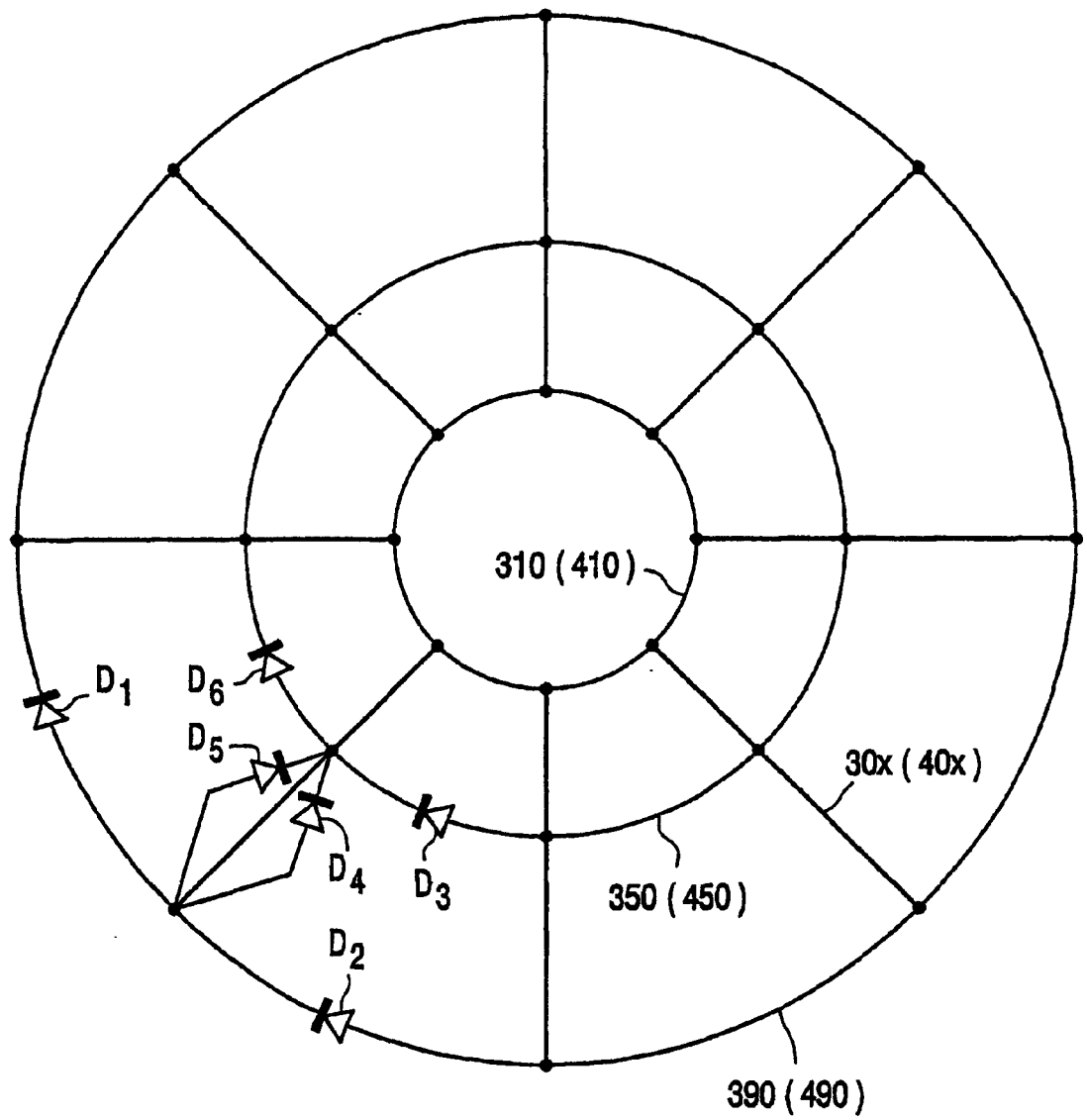
FIG. 13 shows various examples of the application of diodes in the conductor structures.

For the practical application of the RF surface resonator in a magnetic resonance imaging apparatus for the examination of a patient it may be necessary to use local receiving coils that are locally applied. Such coils are magnetically coupled to the planar RF surface resonator and could interfere with the latter and excite undesirable resonance at least in individual closed conductor loops (meshes), which resonance itself could influence the homogeneity of the overall RF field or affect the receiving antenna (that is, reduce the signal-to-noise ratio thereof) or have other undesirable consequences. In order to avoid the foregoing, diodes Dx that can be switched (for example, pin diodes) are inserted in individual or in several conductor segments in conformity with FIG. 13, said diodes enabling the conductor segments to be opened so that a resonant mesh or also the complete RF surface resonator can be switched off.

Moreover, the field variation, or the homogeneity thereof, can be adapted to the shape of an object to be examined by deliberately switching off individual conductor structures. For example, when only a given organ (region of interest or ROI) of a patient is to be examined, in order to avoid unnecessary exposure of the patient to the radiation (field) load, the shape of the exposed zone in the y/z plane can be controlled by electronic switching over such that essentially only the relevant organ is exposed to the RF field.

Finally, it is also possible to utilize the diodes in the outer conductor 390, 490 for switching over between opposed circular polarization directions, and hence also between the transmission mode and the receiving mode, when a respective point for coupling in is situated between the diodes.

Figure 14:
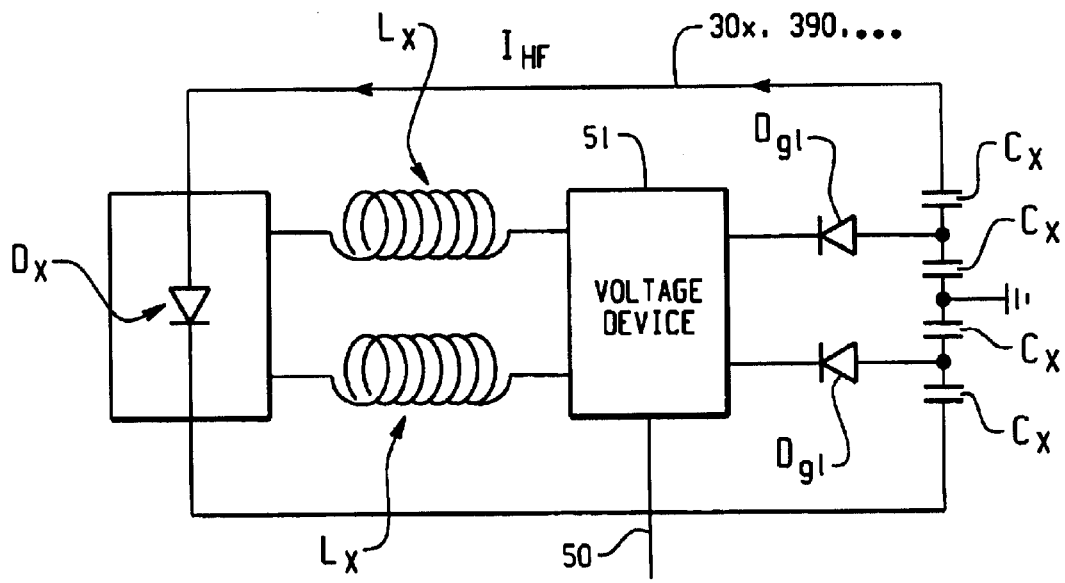
FIG. 14 shows a block diagram of a diode circuit to be switched on in the conductor structures.

FIG. 14 shows a corresponding control circuit for the pin diodes Dx. A special advantage of this circuit resides in the fact that control takes place via an optical fiber 50 which, as opposed to an electrical conductor, does not influence the RF surface resonator. The supply voltage for the diodes Dx is then derived from the RF current that flows through the relevant conductor structure 30x, 390, ... in the transmission mode, so that no external supply voltage is required. More specifically, the rectifier diodes Dgl1, Dgl2, being connected to the relevant conductor structure via capacitors Cx, serve for this purpose; they apply the rectified RF current to a device 51. The device 51 includes a capacitor for storing the charges and for smoothing the voltage, so that the diode Dx can also be switched when the antenna operates as a receiving antenna. In order to apply the supply voltage to the diode Dx the device 51 also includes an optocoupler which is connected to the optical fiber 50. Any residual RF components in the supply voltage can ultimately be blocked from the diode Dx by inductances Lx.

The conductor structures of the RF surface resonator are provided on a substrate of epoxy, that is, preferably in the form of strip conductors of copper of a thickness of approximately 100 $\mu$m. The RF shield can be formed by a copper foil of a thickness of from approximately 10 to 20 $\mu$m. It is also possible to encapsulate the conductor structures, the RF shield as well as possibly the separate conductor structure for current return, including the described components (capacitors, diodes), in an epoxy block so as to form one unit.

In order to prevent excessive heating and hence mechanical damage and/or influencing of the electric properties of such a unit due to the comparatively high loss power during transmission as well as due to its proximity to the gradient coils 3, 4, 5; 6, 7, 8, preferably means are provided for cooling (not shown). Such means may be formed on the one hand by tubes which extend in the x direction (vertical direction) at the area of the outer conductor 390, 490 of the RF surface resonators and via which a cooling medium (for example, a cooling liquid) is transported. On the other hand, the conductor structures of the RF surface resonator can also be constructed as tubes having a rectangular or oval cross-section and a cooling medium can be transported therethrough.

A radiation characteristic that is optimum for practically any application of the RF surface resonator can be achieved by sensible combination of the characteristics described with reference to the FIGS. 3 to 13.

What is claimed is:

1. An RF surface resonator for transmitting and/or receiving circularly polarized electromagnetic waves, comprising a plurality of conductor structures that extend in radial directions from a central zone as well as at least one conductor loop that encloses the central zone and serves as a return for the current of the conductor structures, the radial distance between said conductor loop and the central zone being chosen to be such that a desired radiation characteristic is achieved in a plane extending perpendicularly to the surface resonator.

2. An RF surface resonator as claimed in claim 1, wherein the respective conductor structures are formed by a plurality of conductor segments that form one or more parallelogram-like configurations.

3. An RF surface resonator as claimed in claim 1, wherein the length of the conductor structures is chosen in dependence on a radiation characteristic to be realized in a perpendicular plane.

4. An RF surface resonator as claimed in claim 1, further comprising an RF shield for the RF field of the surface resonator disposed in a plane that extends essentially parallel to said resonator, a local distance between the RF shield and the surface resonator being chosen in conformity with a radiation characteristic to be realized.

5. An RF surface resonator as claimed in claim 4, wherein at least one of the conductor structures and/or at least one of the conductor loops is connected, via a respective capacitor, to the RF shield in order to realize a desired radiation characteristic.

6. An RF surface resonator as claimed in claim 1, further comprising an arrangement of conductor structures and conductor loops which is essentially identical to that of the surface resonator and is arranged essentially parallel thereto, at least one of the conductor structures and/or at least one of the conductor loops of the surface resonator being connected, via a respective capacitor, to the conductor structures or conductor loops of the further arrangement in order to realize a desired radiation characteristic.

7. An RF surface resonator as claimed in claim 1, further comprising a respective capacitor disposed in at least one of the conductor structures and/or in at least one of the conductor loops in order to realize a desired radiation characteristic.

8. An RF surface resonator as claimed in claim 1, wherein at least one of the conductor loops is formed by a coaxial conductor structure, the length of a shield of the coaxial conductor structure being proportioned so as to realize a desired radiation characteristic.

9. An RF surface resonator as claimed in claim 1, further comprising a respective switchable diode disposed in at least one of the conductor structures and/or in at least one of the conductor loops, switching over of the radiation characteristic of the surface resonator being possible by operating the diodes in the reverse direction or in the forward direction.

10. An RF surface resonator as claimed in claim 9, wherein the diodes are pin diodes whose supply voltage is derived from an RF current that flows in the surface resonator, said diodes being switched by way of a light signal that is transported via an optical fiber.

11. A magnetic resonance imaging apparatus for generating a basic magnetic field (vertical field) that extends perpendicularly through an object to be examined, the magnetic resonance imaging apparatus comprising:

an RF surface resonator comprising:
 an outer conductor loop;
 a plurality of conductor structures that extend in radial directions from a central zone to the outer conductor loop; and
 at least one inner conductor loop, disposed at a radial distance from the central zone, that encloses the central zone and serves as a return for the current of the conductor structures, the radial distance between said inner conductor loop and the central zone being chosen to be such that a desired radiation characteristic is achieved in a plane extending perpendicularly to the surface resonator in order to generate a circularly polarized RF field.

* * * * *